US005650640A

United States Patent [19]
Stafford et al.

[11] Patent Number: 5,650,640
[45] Date of Patent: Jul. 22, 1997

[54] INTEGRATED ELECTRO-OPTIC PACKAGE

[75] Inventors: John W. Stafford, Phoenix; Thomas B. Harvey, III, Scottsdale; Franky So, Tempe, all of Ariz.

[73] Assignee: Motorola, Schaumburg, Ill.

[21] Appl. No.: 417,360

[22] Filed: Apr. 5, 1995

[51] Int. Cl.[6] .............................. H01L 27/15; H01L 33/00; H01L 23/48
[52] U.S. Cl. .............................. 257/81; 257/88; 257/734
[58] Field of Search ........................... 257/81, 79, 80, 257/82, 83, 84, 113, 114, 184, 680, 684, 734, 749, 787, 443, 88

[56] References Cited

U.S. PATENT DOCUMENTS 4,984,034  1/1991  Yamazaki .................... 257/88

*Primary Examiner*—Carl W. Whitehead
*Assistant Examiner*—Jhihan B. Clark
*Attorney, Agent, or Firm*—Eugene A. Parsons

[57] ABSTRACT

An integrated electro-optical package including an electronic circuit mounted on a substrate, first and second groups of leads extending from the circuit through a sealing area and each lead having an end exposed in a first area, transparent conductive strips positioned in the first area and each strip contacting the exposed end of a lead in the first group, an electroluminescent medium positioned on each of the strips and defining LEDs, metallic strips positioned over the electroluminescent medium as a second electrode for each of the LEDs, each metallic strip being in contact with an exposed end of an electrical lead in the second group of leads, and a hermetic seal positioned in sealing contact with the sealing area and hermetically sealing the first area.

21 Claims, 6 Drawing Sheets

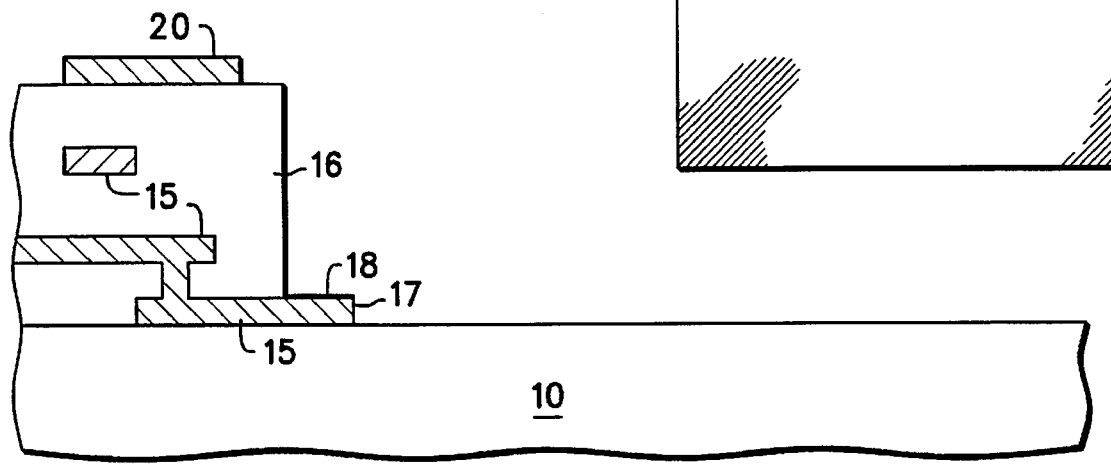
FIG. 1
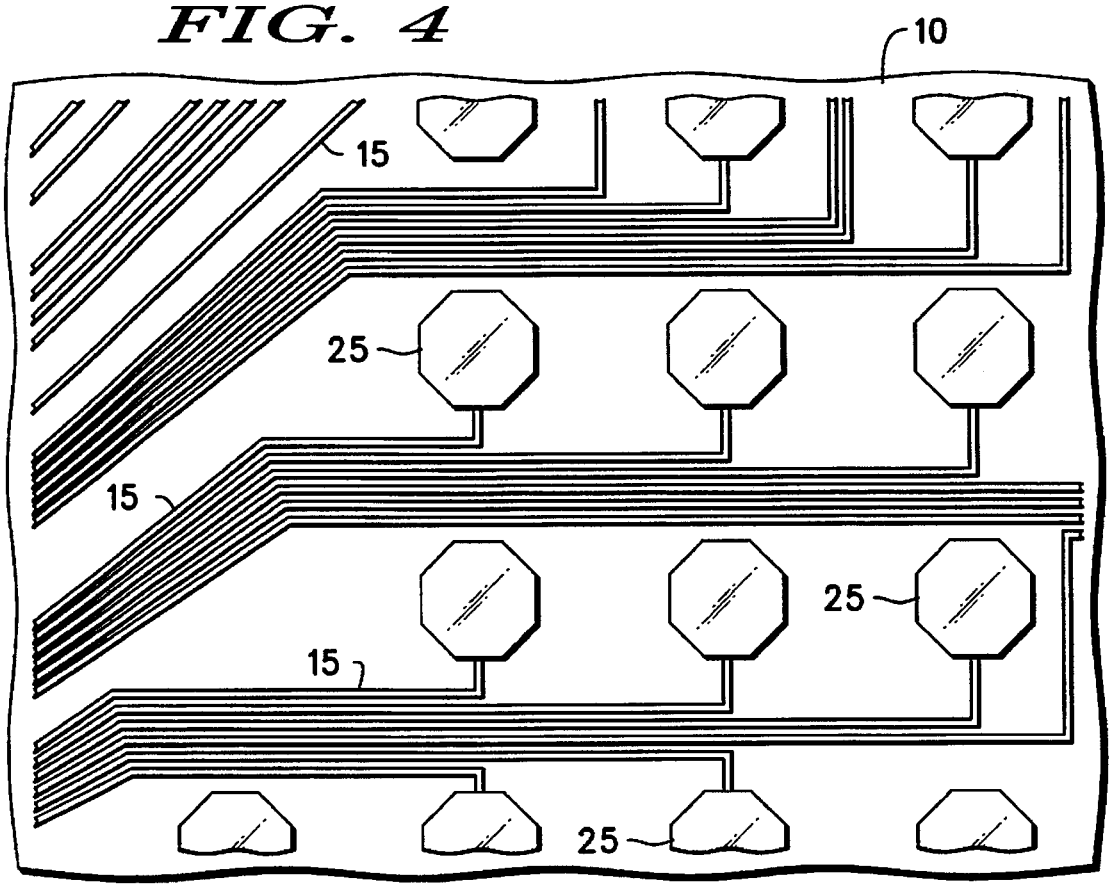
FIG. 2
FIG. 4

INTEGRATED ELECTRO-OPTIC PACKAGE

FIELD OF THE INVENTION

The present invention pertains to integrated electro-optic packages and more specifically to integrated electro-optic packages incorporating organic light emitting devices.

BACKGROUND OF THE INVENTION

Generally, a semiconductor substrate, or integrated circuit, is mounted on a printed circuit board or the like and the accepted method for connecting the substrate to external circuits is to use standard wire bond technology. However, when a semiconductor substrate having a relatively large array of electrical components or devices formed thereon is to be connected, standard wire bond techniques can become very difficult. For example, if a relatively large array (greater than, for example, 10,000 or 100×100) of light emitting devices, or diodes, (LEDs) is formed on a substrate with a pitch (center-to-center separation) of P, then bond pads on the perimeter of the substrate will have a 2P pitch. This is true because every other row and every other column goes to an opposite edge of the perimeter to increase the distance between bond pads as much as possible.

At the present time wire bond interconnects from bond pads having a pitch of 4.8 milli-inches is the best that is feasible. Thus, in the array mentioned above of 100×100 LEDs the bond pads on the perimeter of the substrate would have a minimum pitch of 4.8 milli-inches, with 50 bond pads situated along each edge of the perimeter. As more devices are included in the array, more bond pads are required and the perimeter size to accommodate the additional bond pads increases at an even greater rate. That is, since the minimum pitch of the bonding pads is 4.8 milli-inches, the pitch of the devices in the array can be as large as 2.4 milli-inches, or approximately 61 microns, without effecting the size of the substrate. Thus, even if the devices can be fabricated smaller than 61 microns, the minimum pitch of the bonding pads will not allow the perimeter of the substrate to be made any smaller. It can quickly be seen that the size of the substrate is severely limited by the limitations of the wire bonding technology.

When the array of LEDs is fabricated with organic materials, several additional problems are prevalent. A two-dimensional organic LED array for image manifestation apparatus applications is composed of a plurality of organic LEDS (one or more of which form a pixel) arranged in rows and columns. Each individual organic LED in the array is generally constructed with a light transmissive first electrode, an organic electroluminescent medium deposited on the first electrode, and a metallic electrode on top of the organic electroluminescent medium. The electrodes of the LEDs are connected to form a two-dimensional X-Y addressing pattern. In practice, the X-Y addressing pattern is achieved by patterning the light transmissive electrodes in an X direction and patterning the metallic electrodes in a Y direction (or vice versa if desired), with the X and Y directions being perpendicular to each other. The patterning of the electrodes is usually accomplished by either shadow mask or etching techniques. Due to the technical limits of shadow masks, etching processes are generally being utilized for high density information displays, which have pixel pitches less then 0.1 mm.

Depending on the medium used in the etching processes, the etching technique can be divided into two categories: wet and dry. While wet etching is generally performed in an acidic liquid medium, dry etching is usually done in a plasma atmosphere.

The metallic electrodes used for cathode contacts in organic LEDs usually contain a stable metal and a highly reactive metal with a work function less then 4 eV. The presence of the highly reactive metal in the metallic electrode makes acid-based wet etching undesirable. However, the dry etching processes is also problematic because of the high temperature (>200° C.) and reactive ion atmosphere required in the process, which may affect the integrity of the organic materials as well as the active metal containing metallic electrodes in a two-dimensional organic LED array.

To overcome the etching dilemma, a shadow wall method to fabricate the two-dimensional array has been disclosed by Tang in a U.S. Pat. No. 5,294,870, issued Mar. 15, 1994 and entitled "Organic Electroluminescent Multicolor Image Display Device". The shadow wall method includes: patterning the transparent electrode first; building dielectric walls that are orthogonal to the transparent electrodes, capable of shadowing an adjacent pixel area, and with a height exceeding the thickness of the organic medium; depositing an organic electroluminescent medium; and depositing the cathode metals from an angle of 15° to 45° with respect to the deposition surface. Since the height of the dielectric walls exceeds the thickness of the organic medium, isolated parallel metal stripes are formed. Thus, a X-Y addressable array is achieved without the need of metal etching. Though this method seems to be viable for metal patterning, it is limited to certain pitch dimensions, and potentially could introduce defects in pixels in the array.

Also, most organic LEDs are highly susceptible to ambient conditions, especially moisture. Because of the impact of moisture on the performance of organic LEDs, the LEDs must be in a total hermetic enclosure.

Thus, there is a need for interconnect and packaging structures and techniques in which organic LEDs can be conveniently incorporated.

There is also a need for interconnect and packaging structures and techniques which can substantially reduce the limitation on size of the package.

Accordingly, it would be highly advantageous to provide a new LED array/package and method of manufacturing which overcame these problems.

It is a purpose of the present invention to provide integrated electro-optical packages in which organic LEDs can be conveniently incorporated.

It is also a purpose of this invention to provide a package incorporating a novel method of fabricating a two-dimensional organic LED array for high density information image manifestation apparatus applications.

It is another purpose of this invention to provide an organic LED device package on which metal etching can be performed without effecting the LEDs.

It is still another purpose of this invention to provide a passivated two-dimensional organic LED array and package for high density information image manifestation apparatus applications with improved reliability.

It is another purpose of the present invention to provide integrated electro-optical packages with organic LEDs which are not limited in size by the electrical connections.

It is yet another purpose of the present invention to provide integrated electro-optical packages containing arrays of organic LEDs which are hermetically sealed from ambient conditions.

It is a further purpose of the present invention to provide methods of fabricating integrated electro-optical packages incorporating organic LEDs which do not damage the LEDs during fabrication.

SUMMARY OF THE INVENTION

The above problems and others are at least partially solved and the above purposes and others are realized in an integrated electro-optical package including an optically transparent substrate with a substantially planar surface, the substrate having defined thereon a first area, a sealing area surrounding the first area and an integrated circuit area adjacent the sealing area and outside of the first area. An electronic circuit, including at least one semiconductor chip, is mounted in the integrated circuit area. First and second groups of electrical leads, connected to the electronic circuit, extend from the electronic circuit through the sealing area and into the first area and each lead of each of the first and second groups has an end exposed in the first area. A plurality of parallel, laterally spaced apart, optically transparent, electrically conductive strips are positioned on a surface of the supporting substrate in the first area so as to define a plurality of first electrodes, each conductive strip of the plurality of conductive strips has an end in electrical contact with an exposed end of an electrical lead in the first group of the electrical leads so that each conductive strip of the plurality of conductive stripes is in electrical contact with a different lead of the first group of leads. An electroluminescent medium is positioned on each of the plurality of first electrodes so as to define a light emitting diode in conjunction with an associated first electrode of each of the plurality of electrodes. A layer of metal is positioned over the electroluminescent medium so as to define a plurality of parallel, laterally spaced apart, metallic strips orthogonal to the plurality of conductive strips. The laterally spaced apart, metallic strips define a second electrode for each of the light emitting diodes. Each metallic strip of the plurality of metallic strips has an end in electrical contact with an exposed end of an electrical lead in the second group of leads so that each metallic strip of the plurality of metallic stripes is in electrical contact with a different lead of the second group of leads. A hermetic seal is positioned over the first area and in sealing contact with at least the sealing area of the surface of the substrate so as to hermetically seal the first area.

The above problems and others are at least partially solved and the above purposes and others are realized in a method of fabricating an integrated electro-optical package including the steps of providing an optically transparent substrate with a substantially planar surface, defining on the surface of the substrate a first area, a sealing area surrounding the first area and an integrated circuit area adjacent the sealing area and outside of the first area, forming first and second groups of electrical leads extending from the integrated circuit area through the sealing area and into the first area with each lead of each of the first and second groups having an end exposed in the first area, forming a plurality of parallel, laterally spaced apart, optically transparent, electrically conductive strips on a surface of the supporting substrate in the first area so as to define a plurality of first electrodes, and positioning the conductive strips so that each conductive strip of the plurality of conductive strips has an end in electrical contact with an exposed end of an electrical lead in the first group of the electrical leads such that each conductive strip of the plurality of conductive stripes is in electrical contact with a different lead of the first group of leads, positioning an electroluminescent medium on each of the plurality of first electrodes so as to define a light emitting diode in conjunction with an associated first electrode of each of the plurality of first electrodes, positioning a layer of metal over the electroluminescent medium so as to define a plurality of laterally spaced apart, metallic strips orthogonal to the plurality of conductive strips, the laterally spaced apart, metallic strips defining a second electrode for each of the light emitting diodes, contacting an end of each of the metallic strips with an exposed end of an electrical lead in the second group of leads so that each metallic strip of the plurality of metallic stripes is in electrical contact with a different lead of the second group of leads, mounting an electronic circuit, including at least one semiconductor chip, in the integrated circuit area and electrically connecting one end of each lead in each group to the electronic circuit, and sealingly engaging a hermetic seal over the first area and in sealing contact with at least the sealing area of the surface of the substrate.

BRIEF DESCRIPTION OF THE DRAWINGS

Referring to the drawings:

FIG. 1 is a top plan view of a typical substrate used in the present novel methods;

FIG. 2 is a greatly enlarged sectional view, portions thereof broken away, of a partially completed integrated electro-optical package, being fabricated on the substrate of FIG. 1 in accordance with the present invention;

FIG. 4 is a greatly enlarged portion of the top plan view of FIG. 3;

DESCRIPTION OF THE PREFERRED EMBODIMENTS

Figure 3:
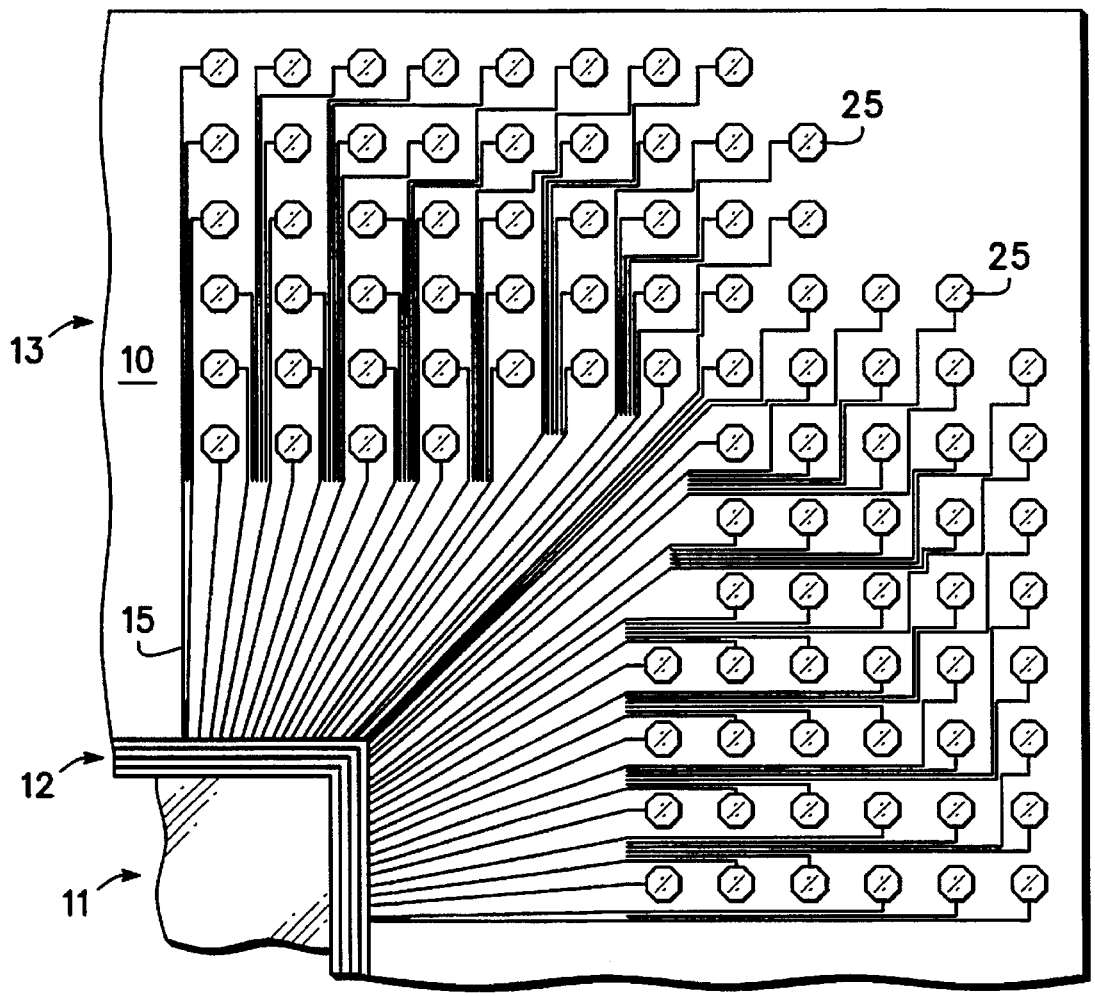
FIG. 3 is a view in top plan of the structure of FIG. 2.

Referring specifically to FIG. 1, a substrate 10 is illustrated having an upper planar surface with a first area 11, a sealing area 12 and an integrated circuit mounting area 13 defined thereon. Substrate 10 is an optically transparent substrate which can be formed of glass, optical quality plastic (generally having an index of refraction of 1.5 to 1.6), or any other convenient material that will serve the purposes, which will be apparent presently.

Referring to FIG. 2, a view in side elevation is illustrated of substrate 10 with some initial steps in a novel method of fabricating an integrated electro-optic package in accordance with the present invention having been performed. Portions of substrate 10 are broken away so that only a portion of first area 11 and sealing area 12 can be seen. Utilizing some convenient technique, such as a moisture impervious fine line interconnect technology, a plurality of electrical leads 15 are formed, extending from mounting area 13 through sealing area 12 and into first area 11.

Dielectric material 16 is formed during the lead fabrication to aid in forming and positioning leads 15 correctly and is retained as a portion of a hermetic seal, to be explained presently. It will of course be understood that dielectric material 16 may include several layers formed during the fabrication of electrical leads 15 and may be only in the sealing area or may extend into a portion or all of the mounting area. As an example, a substrate technology using sol-gel processing techniques produces such an inorganic interconnect.

Electrical conductors 15 are thin film conductors deposited by some convenient means, such as sol-gel processes, sputtering, or evaporation, and patterned during deposition or etched subsequently to form the metal into the desired configuration. Each electrical lead 15 has an exposed end 17 positioned in first area 11 of substrate 10. To aid in further processing, a gold metallized surface 18 is formed on exposed end 17 of each electrical lead 15. While gold is used, for purposes which will be explained presently, it should be understood that other convenient metals may be utilized.

A hermetic sealing ring 20 is positioned on an upper surface of dielectric material 16 and extends completely around first area 11 of substrate 10. Ring 20 can be formed of any convenient sealing material, such as solder, glass, etc. with the type of material depending on the type of hermetic cover which is used.

Referring specifically to FIG. 3, a view in top plan of the structure of FIG. 2 is illustrated. In a preferred embodiment, optically transparent substrate 10 is formed of a planar piece of optically transparent material, such as glass, so that at least first area 11 is simply a clear (optically transparent) portion of substrate 10. First area 11 is substantially the same size as an array of LEDs (to be described) so that the real image generated by the array of LEDs in cooperation is completely visible therethrough. The plurality of electrical leads 15 provide electrical connections for the rows and columns of LEDs to a similar plurality of connection pads 25 positioned in mounting area 13 and, generally, around the outer periphery of substrate 10. To completely distribute electrical leads 15 and connection pads 25 around the periphery of optically transparent substrate 10, electrical leads 15 are attached to alternate rows and alternate columns. Thus, the space available between adjacent electrical leads 15 is 2P, or in this specific embodiment approximately 20 microns.

Referring to FIG. 4, a greatly enlarged portion of FIG. 3 is illustrated showing portions of optically transparent substrate 10 in greater detail. The plurality of electrical leads 15 are positioned on optically transparent substrate 10 and are fanned out from the periphery of first area 11 and sealing area 12 into contact with connection pads 25. In this specific embodiment, connection pads 25 are positioned in a matrix of rows and columns surrounding sealing area 12. Generally, it is anticipated that connecting pads 25 can be positioned in the matrix with a pitch in the range of approximately 25 milli-inches to 50 milli-inches to allow sufficient space for electrical leads 15 to extend therebetween as illustrated. For example, a matrix of connection pads 25 with a pitch of 40 milli-inches allows over 500 connection pads 25 on a one inch by one inch substrate with a first area 11 of 0.2 inches by 0.4 inches.

By fanning out electrical leads 15, connection pads 25 can be constructed large enough to provide easy electrical contact thereto. For example, if the LED array includes 40,000 devices (e.g., 200 rows×200 columns) and each device includes an area having a 10 micron diameter with a pitch P of 20 microns, then the size of first area 11 of optically transparent substrate 10 will be less than 0.2 inches on a side. Optically transparent substrate 10, in this specific example, is constructed with a first area 13 approximately 0.2 inches on a side and an outer periphery of 0.5 inches on a side. Thus, the 200 connection pads on each side of the periphery of substrate 10 have approximately 60 microns of pitch available.

In the instance in which optically transparent substrate 10 is formed of glass, standard thin film metallization can be utilized, at least for electrical leads 15 and connection pads 25, in which layers of metal are deposited by, for example, sputtering. Also, sol-gel technology, incorporating the usual steps of printing, patterning and firing, can be utilized. In a typical metallization system, a first layer of chromium is applied by sputtering to operate as an adhesive layer on the glass. A second layer of copper is applied over the chromium to provide the desired electrical conduction and a layer of gold is applied over the copper to provide a barrier and adhesive layer for further connections. It should be understood that the metallization can be either an additive or subtractive method with the patterning and etching being performed by any of the various methods well known in the art to provide the desired final structure.

In many applications the widths of electrical leads 15 and the sizes of pads 25, as well as spacing, may be such that difficulty will be encountered in the fabrication, especially for the substrate. However, glass is an example of an optically transparent substrate material on which 10 to 15 micron wide electrical conductors with a pitch of 40 microns can be fabricated. Further, by stacking dielectric material 16 and electrical leads 15, as illustrated, some additional benefits in size can be realized.

Figure 5:
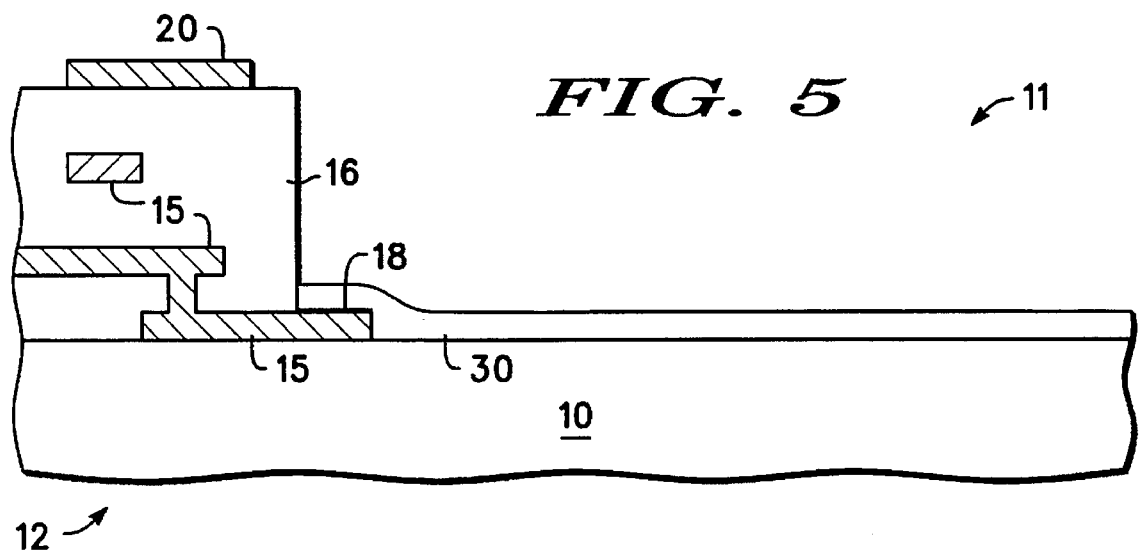
FIG. 5 is a view similar to FIG. 2, with additional steps of the fabrication method completed.

Referring specifically to FIG. 5, a view similar to FIG. 2 is illustrated in which some additional steps have been performed. A plurality of parallel, laterally spaced apart, optically transparent, electrically conductive strips 30 are formed on the surface of substrate 10 in first area 11. Generally, strips 30 are formed by depositing a layer of material and etching the layer to form strips 30 or by masking and performing metal lift-off techniques well known in the art. Each conductive strip 30 of the plurality of conductive strips is in electrical contact with an exposed end of one electrical lead 15. Electrical leads 15 are generally divided into a first group of leads that connect to the columns of the array and a second group that connect to the rows of the column. In this example, the first group of electrical leads 15 is connected to conductive stripes 30 so that each conductive strip 30 is in electrical contact with a different lead 15 of the first group of leads.

In a specific embodiment, substrate 10 is made of glass or polymeric materials and has deposited thereon a layer of light transmissive, electrically conductive material, which is selected from a variety of organic or inorganic conductors, such as conductive polyaniline (PANI),or indium-tin-oxide (ITO). The layer is then patterned by conventional lithography technique to form a plurality of parallel conductive strips 30 that are capable of being addressed in a column fashion and will serve as an anodic electrode in the final array.

Figure 6:
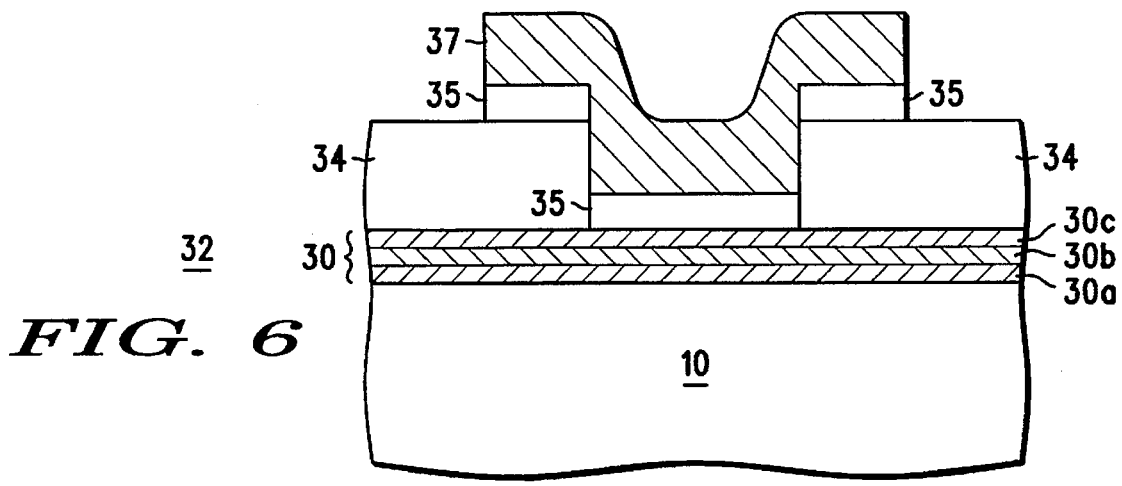
FIG. 6 is a greatly enlarged sectional view of a single organic LED in an array of LEDs.

Now referring specifically to FIG. 6, a cross sectional view of a single LED 32, from a two dimensional LED array, is depicted for convenience. On the top of conductive strips 30, a layer 34 of dielectric medium is deposited by thermal evaporation, sputtering or plasma enhanced chemical vapor deposition techniques. Layer 34 is then patterned by conventional wet or dry etch techniques to form a plurality of cavity (well or a trench, hereinafter referred to as a well) structures. Inside each cavity, and on the upper surface of conductive strips 30 (the anodic electrode), is deposited an electroluminescent medium 35, which generally consists of a layer of hole transporting material, a layer of active emitter material, a layer of electron transporting material and a layer of a low work function metal. It will of course be understood by those skilled in the art that in some applications either or both of the layers of hole transporting material and electron transporting material can be eliminated, in most instances with a result of somewhat poorer operation.

The top of the cavities is then sealed by evaporation of a thick layer 37 of stable metal such as aluminum, silver, copper or gold as a cavity cap. Layer 37 is selected to form a good electrical contact with the layer of low work function material in electroluminescent medium 35 and, in conjunction with the layer of low work function metal of electroluminescent medium 35, forms the cathode electrode for LED 32. Layer 37 is then lithographically patterned to form a plurality of parallel, laterally spaced apart, metallic strips 38 oriented generally orthogonal to the plurality of conductive strips 30.

Dielectric medium 34, used in the construction of the cavity structures, is any convenient organic polymer or inorganic material. However, it is preferred to use an inorganic dielectric material such as silicon dioxide, silicon nitride, alumina, etc. which is usually a better barrier to oxygen and moisture then organic polymer materials. The thickness of dielectric medium 34, which determines the depth of the cavity structures, may vary from 10 µm to 0.1 µm and, for ease of processing, a thickness of less then 1 µm is preferred.

The materials used as electroluminescent medium 35 in the two-dimensional array of this invention can include any of the materials of organic EL devices disclosed in the prior art. As stated above, electroluminescent medium 35 generally consists of a layer of hole transporting material, a layer of active emitter material, a layer of electron transporting material and a layer of low work functional metal. Polymers, organic molecules and organometallic complexes can be used as hole transporting materials, active emitters and electron transporting materials. In the active emitter layer, a fluorescent dopant used for enhancement of the device efficiency can also be incorporated. Generally, any metals with a work function less than approximately 4.0 eV can be used as the cathode material, e.g. lithium, magnesium, indium, calcium, etc.

The organic electroluminescent media can be deposited by vacuum evaporation. Organic electroluminescent media can also be deposited by other techniques such as injection-fill, spin-coating, roll-coating, dip-coating or doctor-blading from a suitable solution when polymeric materials are used. A mixture of the above-mentioned techniques may be needed in cases where a heterostructure array composed of both small organic molecule materials and polymers is to be built.

Figure 7:
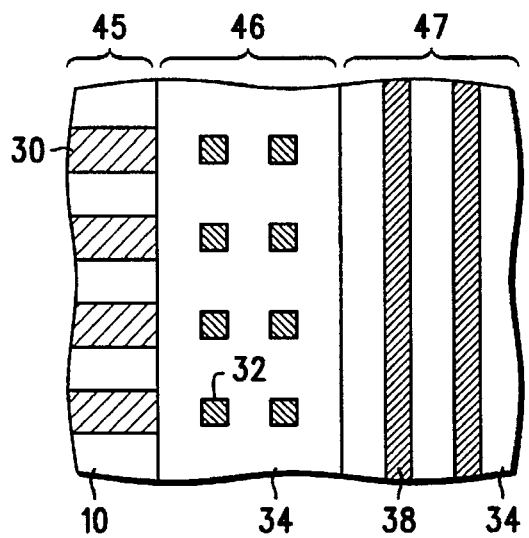
FIG. 7 is a view in top plan of an array of LEDs similar to that of FIG. 6, with portions thereof broken away for ease of visualization.

Referring now to FIG. 7, a plan view of a two-dimensional array 40 of LED well structures embodying the present invention is illustrated, with portions broken away for ease of visualization. Proceeding from left to right in FIG. 7, an area 45 is a plan view of array 40 at a stage where patterned transmissive, conductive strips 30, forming column (anode) electrodes, are positioned on light transmissive, electrically insulative substrate 10.

A central area 46 in FIG. 7 illustrates a stage where individual LEDs 32 are defined by wells containing organic electroluminescent medium and low (less than 4.0 eV) work function metal as an n-contact (cathode). The wells are formed in the array after depositing a layer of dielectric medium 34 on top of patterned strips 30 and substrate 10 and patterning the dielectric medium 34 photolithographically to form the well structures, as illustrated in area 46.

An area 47 is a plan view of array 40 after a layer 37 of an ambient stable metal cap has been deposited on top of dielectric medium 34 with the well structures formed therein (area 46) and patterned into metallized strips 38 as row electrodes. In this simplified embodiment, each LED forms a pixel and by addressing specific LEDs by row and column in a well known manner, the specific LEDs are energized to produce a real image which is transmitted downwardly through substrate 10.

It will be understood by those skilled in the art that LED array 40 and substrate 10 are greatly enlarged in the FIGS. The actual size of substrate 10 is on the order of a few milli-meters (2 mm to 10 mm) along each side with each LED being on the order of 5 to 50 microns on a side (or in diameter if the LED is round). Because of the extremely small size of substrate 10, electrical leads 15, conductive strips 30 and metallized strips 38 have a very small cross-section, which severely limits their current carrying capacity, or current density.

In one typical operation, the image is formed by sequentially turning on the rows of pixels and supplying video data to the columns. In this scheme only one row at a time is addressed or "turned ON". Thus, the conductive strips 30 for each column need to carry only sufficient current for one LED (the one LED in the row which is ON). However, all of the LEDs in the ON row could potentially be turned ON simultaneously. Thus, the metallized strips 38 for the ON row, which can potentially be required to carry current for however many LEDs are in the row (e.g. 100 to 1500 LEDs), must carry many times as much current as the column metal traces.

Generally, the material forming conductive strips 30 will be less conductive then, for example, metallized strips 38. This is because the material must be not only electrically conductive but it must be optically transmissive, or substantially transparent (conduct at least 80% of the light generated in array 40). To offset this difference in conduction, conductive strips 30 are used as column conductors and metallized strips 38 are used as row conductors.

In a further embodiment, it should be noted that in some instances it might be difficult to form the conductive light transmissive material (e.g. ITO) in a thick layer because of the manner of deposition and the fact that the surface becomes non-uniform. To compensate for this problem a novel method of forming low resistance conductive strips 30 is illustrated in FIG. 6 wherein conductive strip 30 is formed of a first layer 30a of a conductive light transmissive material, a second very thin layer 30b of metal, and a third layer 30c of conductive light transmissive material. Layer 30b is thin enough to transmit light but it still forms a relatively planar base for third layer 30c. Thus, the conductive strip 30 can be made more conductive and the thickness or depth will remain relatively uniform. In some instances it may be desirable to begin or terminate the formation of conductive strip 30 with a thin metal layer to aid in making further connections thereto. In the structure of FIG. 5, for example, a gold metallized surface 18 on electrical leads 15 is very compatible with ITO used as conductive strips 30. However, if a different metal were used as metallized surface 18 it might be desirable to begin conductive strip 30 with a very thin layer of metal followed by a layer of ITO or the like.

Figure 8:
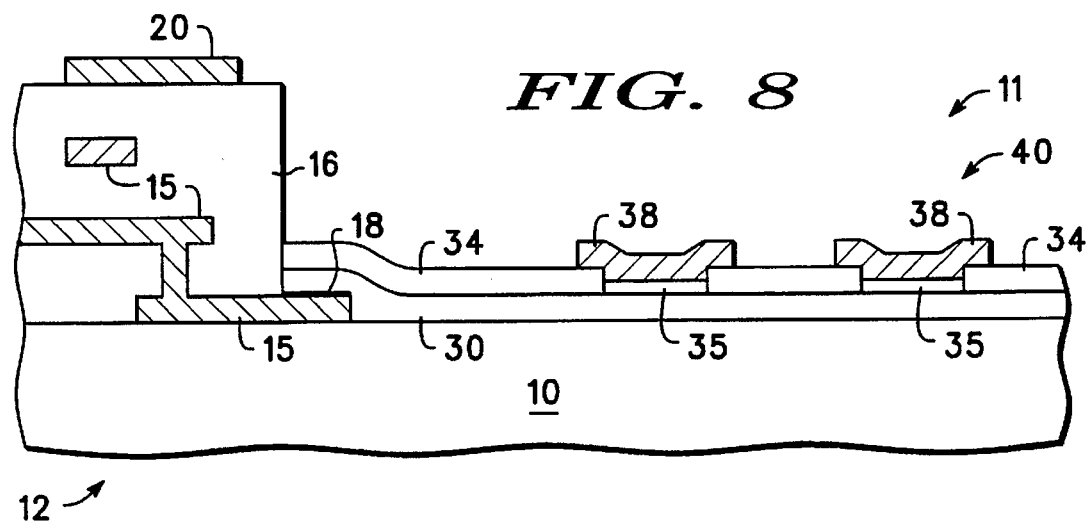
FIG. 8 is a view similar to FIG. 5, with additional steps of the fabrication method completed.
Figure 9:
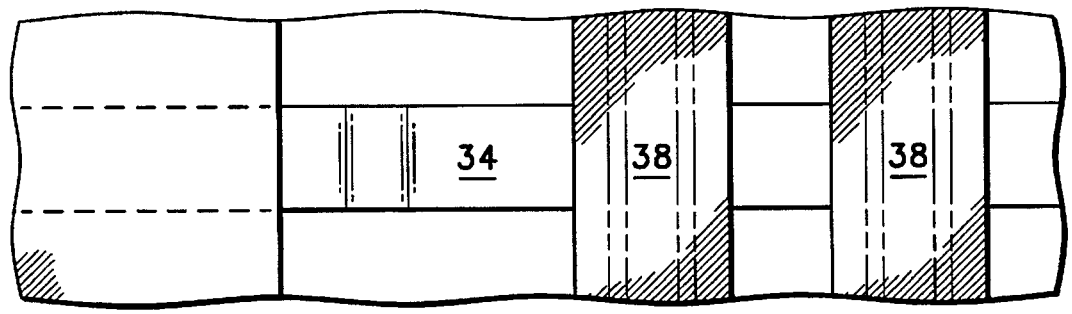
FIG. 9 is a view in top plan, portions thereof broken away, of the structure illustrated in FIG. 8.

Referring specifically to FIG. 8, a sectional view is illustrated of portions of areas 11 and 12 of substrate 10, with an array 40 of LEDs 32 formed in first area 11 as described above. A top plan view of the structure of FIG. 8 is illustrated in FIG. 9 to aid in providing a complete understanding of the structure. Metallized leads 38 extend to the juncture of first area 11 with sealing area 12 (the edge of dielectric material 16) where they electrically contact a second group of electrical leads 15.

Figure 10:
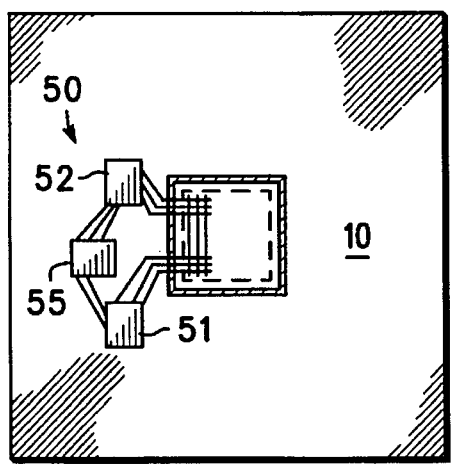
FIG. 10 is a view in top plan of a partially completed package in accordance with the present invention.
Figure 11:
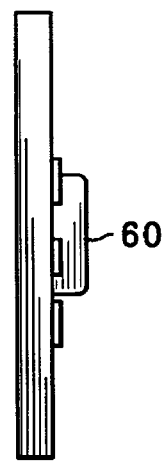
FIG. 11 is a view in side elevation of the package of FIG. 10 after completion.

Electrical leads 15 connected through pads 25 to an electronic circuit 50 are illustrated in a top plan view in FIG. 10 and a side elevational view in FIG. 11. Electronic circuit 50 includes at least one semiconductor chip and in this specific example includes a column driver chip 51 connected through the first group of leads 15 to conductive strips 30, a row driver chip 52 connected through the second group of leads 15 to metallized strips 38, and a controller chip 55 connected through leads similar to leads 15 to chips 51 and 52 and to external terminals for receiving input data. Chips 51, 52 and 55 are mounted on substrate 10 in area 13 by any convenient means, such as wire bonding, solder bumps, flip chip bonding, etc. Generally, the chips making up electronic circuit 50 can be mounted on substrate 10 and connected to pads 25 at any convenient time subsequent to the formation of LED array 40.

To complete the package, a hermetic cover 60, illustrated in FIG. 11, is affixed to sealing ring 20 on dielectric material 16 by any convenient method. As one specific example, hermetic cover 60 can be formed of metal it can be affixed to sealing ring 20 using soft solder preforms of a compatible solder which is heated to fixedly hold cover 60 in place and to form a hermetic seal enclosing LED array 40. In a second specific example, hermetic cover 60 can be formed of a glass plate and sealing ring 20 is a liquid glass material that fuses with cover 60 to hermetically seal LED array 40. In both cases, if desired, a desiccant can be incorporated as part of hermetic cover 60 to insure moisture free environment for an extended period of time.

Figure 12:
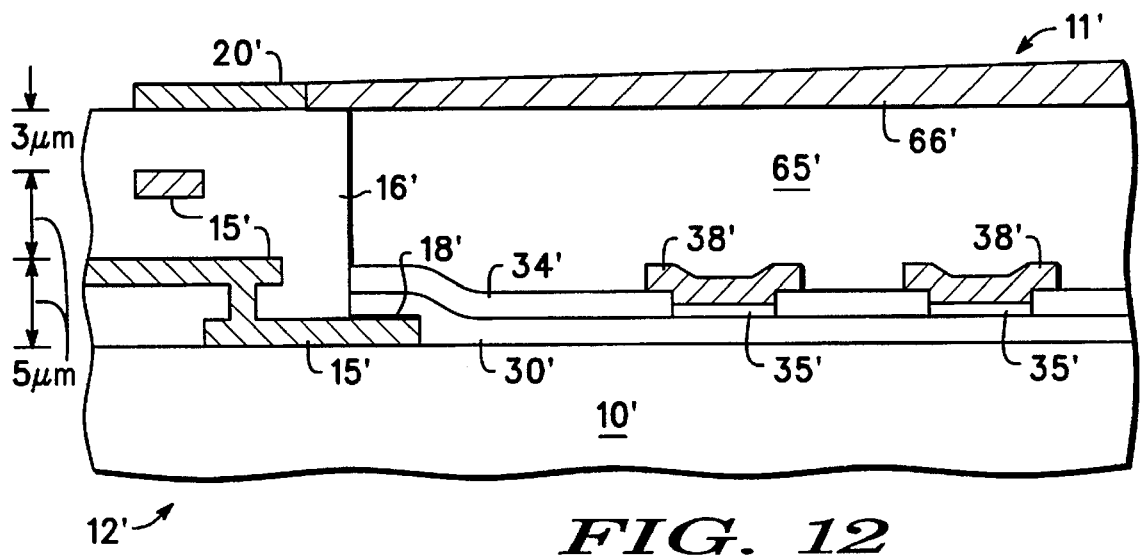
FIG. 12 is a view similar to FIG. 8, with different additional steps of the fabrication method completed.

Referring specifically to FIG. 12, another embodiment in which similar components are designated with similar numbers and a prime is added to all numbers to indicate that it is a different embodiment. In the embodiment of FIG. 12, the metallized strips 38' are formed of an ambient stable metal sealingly positioned over the cavities so that strips 38' form an initial seal. A typical ambient stable metal is indium or a metal with a high indium content. The volume defined by first area 11 and sealing area 12 (the sides of dielectric material 16) is then filled with an inorganic or organic dielectric material 65' selected to provide a relatively good seal. As illustrated in FIG. 12, dielectric material 16 can be formed, for example, 10 to 15 µm thick which results in a relatively thick layer of dielectric material 65'. A metal cap 66' of, for example, indium is then formed over first area 11' and extending onto sealing area 12' to hermetically seal array 40'.

Figure 13:
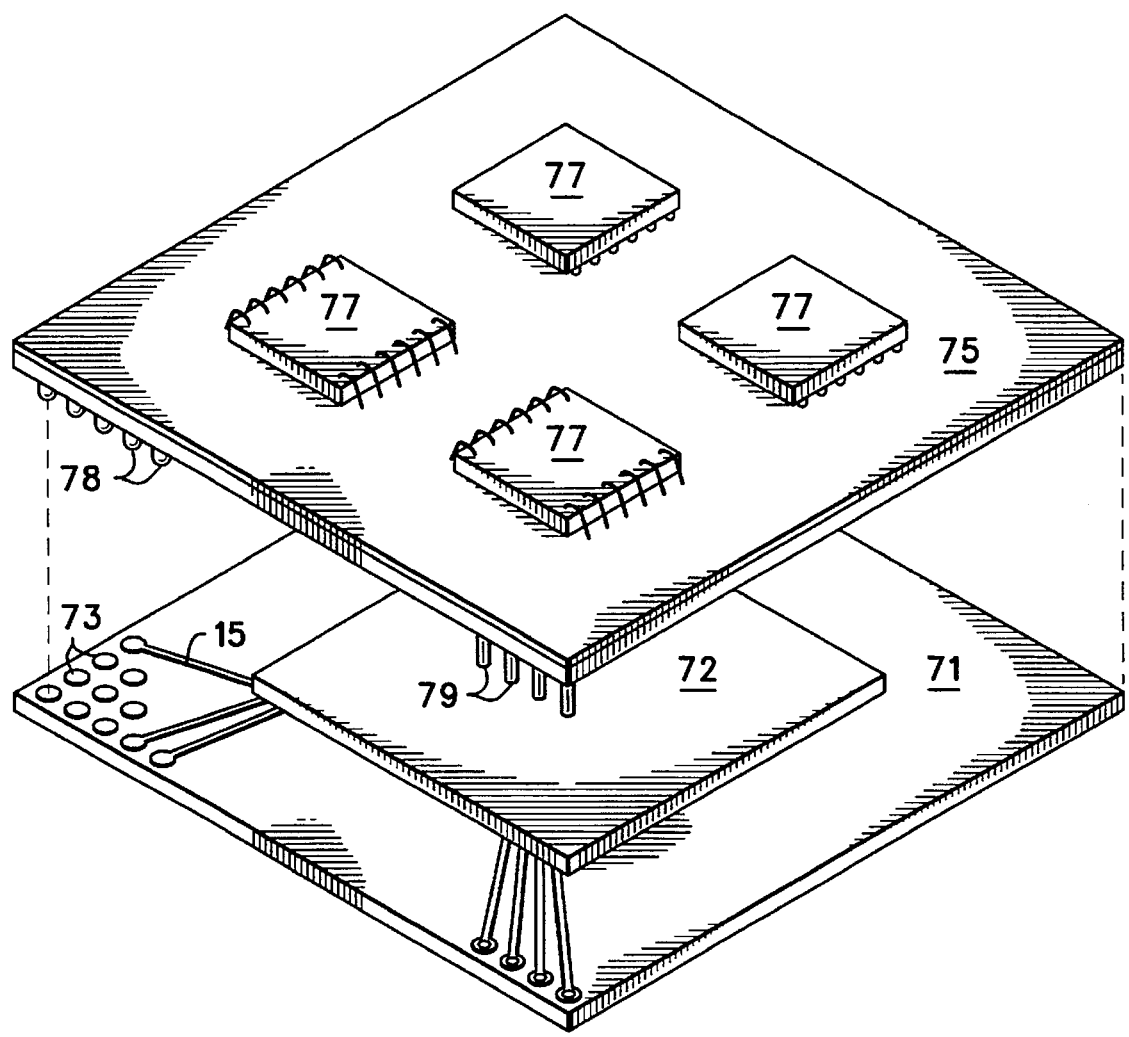
FIG. 13 is an exploded view in perspective of another embodiment of a package in accordance with the present invention.
Figure 14:
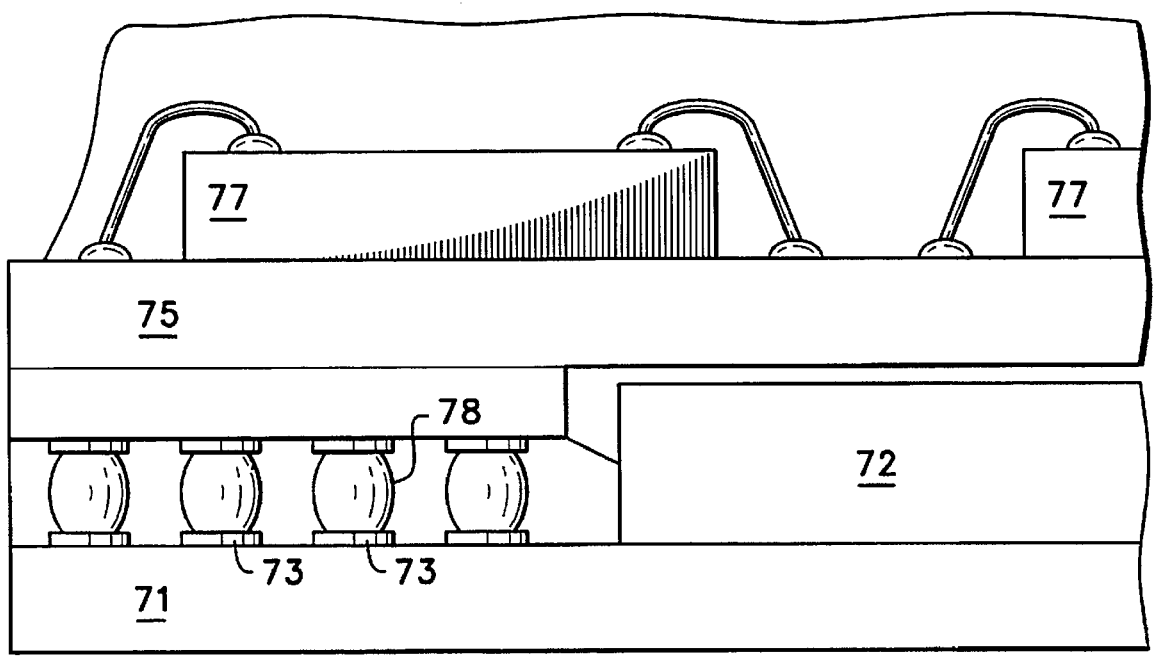
FIG. 14 is a sectional view of the package of FIG. 13 in an assembled state, portions thereof broken away.

In a different embodiment, illustrated in FIG. 13, an exploded view in perspective illustrating the relative positions of components of an electro-optical package 70 is illustrated. An enlarged view, portions thereof broken away, of the components of FIG. 13 assembled into a complete electro-optical package 70 is illustrated in FIG. 14. An optically transparent substrate 71 with an LED array hermetically sealed thereon by a hermetic seal 72 and including connection pads 73 is illustrated. In addition to optically transparent substrate 71, a mounting board, or driver substrate, 75 is included having a plurality of driver and control circuits 77 mounted on an upper major surface thereof. Driver and control circuits 77 generally are formed as semiconductor chips which are wire bonded or bump bonded to electrical contacts on the upper major surface of mounting board 75. Mounting board 75 is, for example, a convenient printed circuit board, such as FR4 or the like, and has either bumps 78 of contact material, such as C5 solder, solderable plated metal, or the like, or connecting pins 79 positioned on a lower major surface thereof. In some specific applications, mounting board 75 could be a driver substrate, or single semiconductor chip, having all of the driver and interconnect components integrated thereon. Because the pitch of connection pads 73 on optically transparent substrate 71 is (or can be) relatively large, relatively large bumps 78 or pins 79 can be utilized at this point.

Bumps 78 are formed of a material that is a relatively good electrical conductor and which can be at least partially melted and reset to form a good physical connection. Material which can be utilized for this purpose includes gold, copper, solder and especially high temperature solder, conducting epoxy, etc. A bump height of up to 80 microns can be formed on a square or round connection/mounting pad with a 20 micron diameter. For smaller pitches, 5 micron diameter copper bumps with a pitch of 10 microns have been formed with a bump height of 20 microns. Also, 15 micron diameter gold bumps on a 30 micron pitch have been formed to a height of 30 to 45 microns. Some compatible metal may improve the assembly procedures, e.g., gold metallization or gold plating on connection pads 73 of optically transparent substrate 71.

Figure 15:
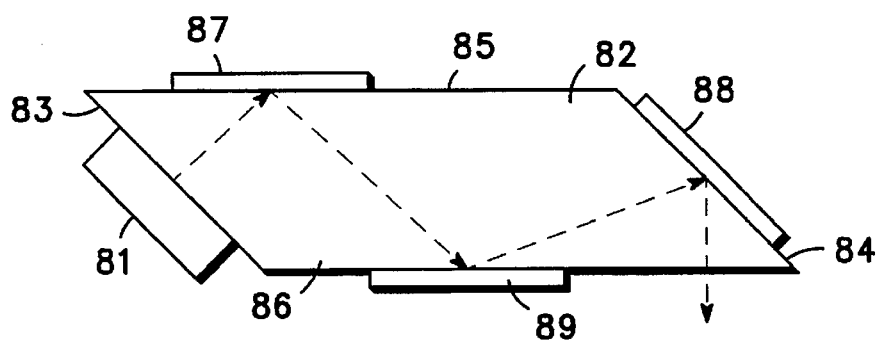
FIG. 15 is a view in side elevation of a miniature virtual image manifestation apparatus incorporating a package in accordance with the present invention.

Referring to FIG. 15, an example of a specific miniature virtual image display 80 is illustrated in a simplified schematic. In waveguide virtual image display 80, an integrated electro-optic package in accordance with the present invention is utilized as image generation apparatus 81, and is affixed to the inlet of an optical waveguide 82 for providing a real image thereto. Waveguide 82 is formed generally in the shape of a parallelogram (side view) with opposite sides, 83, 84 and 85, 86, equal and parallel but not perpendicular to adjacent sides. Side 83 defines the inlet and directs light rays from the real image at apparatus 81 onto a predetermined area on adjacent side 85 generally along an optical path defined by all four sides. Three diffractive lenses 87, 88 and 89 are positioned along adjacent sides 85, 84 and 86, respectively, at three predetermined areas and the magnified virtual image is viewable at an outlet in side 86. This particular embodiment illustrates a display in which the overall size is substantially reduced and the amount of material in the waveguide is also reduced to reduce weight and material utilized.

Thus, improved integrated electro-optic packages are disclosed which are hermetically sealed so that organic type LEDs can be conveniently incorporated into the packages. Also, improved interconnect and packaging structures and techniques are disclosed in which organic LEDs are conveniently incorporated. These improved interconnect and packaging structures and techniques substantially reduce the limitation on size of the packages. Further, an electro-optic package incorporating a novel method of fabricating a two-dimensional organic LED array for high density information image manifestation apparatus applications is disclosed. The novel methods also provide an organic LED device package on which metal etching can be performed without effecting the organic LEDs. Because the Arrays of LEDs are hermetically sealed from ambient moisture and the environment and there is little or no damage during fabrication, the electro-optic packages are greatly improved in reliability, as well as being small and compact.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. An integrated electro-optical package comprising:

an optically transparent substrate with a substantially planar surface, the substrate having a first area defined on the surface thereof, a sealing area defined on the surface thereof and surrounding the first area and an integrated circuit mounting area defined on the surface thereof adjacent the sealing area and outside of the first area;

an electronic circuit, including at least one semiconductor chip, mounted in the mounting area;

first and second groups of electrical leads electrically connected to the electronic circuit, the leads of the first and second groups extending from the mounting area through the sealing area and into the first area and each lead of each of the first and second groups having an end exposed in the first area;

a plurality of parallel, laterally spaced apart, optically transparent, electrically conductive strips positioned on a surface of the optically transparent substrate in the first area so as to define a plurality of first electrodes, each conductive strip of the plurality of conductive strips being in electrical contact with an exposed end of an electrical lead in the first group of the electrical leads so that each conductive strip of the plurality of conductive strips is in electrical contact with a different lead of the first group of leads;

an electroluminescent medium positioned on each of the plurality of first electrodes so as to define a light emitting diode in conjunction with an associated first electrode of each of the plurality of electrodes;

a layer of metal positioned over the electroluminescent medium so as to define a plurality of parallel, laterally spaced apart, metallic strips orthogonal to the plurality of conductive strips, the laterally spaced apart, metallic strips defining a second electrode for each of the light emitting diodes, each metallic strip of the plurality of metallic strips being in electrical contact with an exposed end of an electrical lead in the second group of leads so that each metallic strip of the plurality of metallic strips is in electrical contact with a different lead of the second group of leads; and a hermetic seal positioned over the first area and in sealing contact with at least the sealing area of the surface of the optically transparent substrate so as to hermetically seal the first area.

2. An integrated electro-optical package as claimed in claim 1 wherein the optically transparent substrate is formed of optically transparent glass.

3. An integrated electro-optical package as claimed in claim 1 wherein the plurality of parallel, laterally spaced apart, optically transparent, electrically conductive strips on the surface of the substrate include a patterned layer of indium-tin oxide.

4. An integrated electro-optical package as claimed in claim 1 wherein the hermetic seal includes a hermetic sealing ring positioned in the sealing area and surrounding the first area.

5. An integrated electro-optical package as claimed in claim 1 wherein the first and second groups of electrical leads each include thin film conductors.

6. An integrated electro-optical package as claimed in claim 1 wherein the electroluminescent medium includes one of a layer of polymer and a layer of low molecular weight organic compound.

7. An integrated electro-optical package as claimed in claim 1 wherein the electronic circuit mounted in the mounting area includes a driver circuit connected to each of the first and second groups of electrical leads.

8. An integrated electro-optical package as claimed in claim 1 wherein the electroluminescent medium includes a layer of dielectric medium positioned on an upper surface of the plurality of conductive strips and the supporting substrate and defining a plurality of cavities through the layer of dielectric medium, one each of the plurality of cavities being positioned in overlying relationship to an associated first electrode of the plurality of first electrodes.

9. An integrated electro-optical package as claimed in claim 3 wherein the electrically conductive strips include a thin, optically transparent layer of metal on the patterned layer of indium-tin oxide.

10. An integrated electro-optical package as claimed in claim 9 wherein the electrically conductive strips include a second layer of indium-tin oxide positioned on the optically transparent layer of metal.

11. An integrated electro-optical package as claimed in claim 4 wherein the hermetic seal includes a metal cover engaged with the sealing ring.

12. An integrated electro-optical package as claimed in claim 4 wherein the hermetic seal includes a glass plate engaged with the sealing ring.

13. An integrated electro-optical package as claimed in claim 9 wherein the exposed ends of the first group of thin film conductors in the first area each include a gold metallized surface.

14. An integrated electro-optical package as claimed in claim 8 wherein the electroluminescent medium further includes a layer of active emitter material and a layer of a low work function metal positioned in each of the plurality of cavities on the associated first electrode.

15. An integrated electro-optical package as claimed in claim 14 wherein the layer of metal positioned over the electroluminescent medium includes a layer of ambient stable metal sealingly positioned over the cavities and in contact with the low work function metal.

16. An integrated electro-optical package comprising:

an optically transparent substrate with a substantially planar surface, the substrate having a first area defined on the surface thereof, a sealing area defined on the surface thereof and surrounding the first area and an integrated circuit mounting area defined on the surface thereof adjacent the sealing area and outside of the first area;

an electronic circuit, including at least one semiconductor chip, mounted in the mounting area;

first and second groups of electrical leads electrically connected to the electronic circuit, the leads of the first and second groups extending from the electronic circuit through the sealing area and into the first area and each lead of each of the first and second groups having an end exposed in the first area;

dielectric material positioned in the sealing area and surrounding the first area, the first and second groups of electrical leads extending through and insulated by the dielectric material;

a plurality of parallel, laterally spaced apart, optically transparent, electrically conductive strips positioned on a surface of the optically transparent substrate in the first area so as to define a plurality of first electrodes, each conductive strip of the plurality of conductive strips having an end in electrical contact with an exposed end of an electrical lead in the first group of the electrical leads so that each conductive strip of the plurality of conductive strips is in electrical contact with a different lead of the first group of leads;

an electroluminescent medium positioned on each of the plurality of first electrodes so as to define a light emitting diode in conjunction with an associated first electrode of each of the plurality of electrodes;

a layer of metal positioned over the electroluminescent medium so as to define a plurality of parallel, laterally spaced apart, metallic strips orthogonal to the plurality of conductive strips, the laterally spaced apart, metallic strips defining a second electrode for each of the light emitting diodes, each metallic strip of the plurality of metallic strips having an end in electrical contact with an exposed end of an electrical lead in the second group of leads so that each metallic strip of the plurality of metallic strips is in electrical contact with a different lead of the second group of leads;

a hermetic sealing ring positioned on a surface of the dielectric material in the sealing area and surrounding the first area; and a hermetic cover positioned over the first area and in sealing contact with the sealing ring so as to hermetically seal the first area.

17. An integrated electro-optical package as claimed in claim 16 wherein the hermetic cover includes a metal cover engaged with the sealing ring.

18. An integrated electro-optical package as claimed in claim 16 wherein the hermetic cover includes a glass plate engaged with the sealing ring.

19. An integrated electro-optical package as claimed in claim 16 wherein the hermetic sealing ring includes a patterned layer of metal.

20. An integrated electro-optical package comprising:

a substrate with a substantially planar surface, the substrate having a first area defined on the surface thereof;

a plurality of optically transparent, electrically conductive strips positioned on the surface of the substrate in the first area so as to define a plurality of first electrodes, each conductive strip of the plurality of conductive strips including a patterned first layer of indium-tin oxide positioned on the surface of the substrate and a thin, optically transparent layer of metal positioned on the patterned first layer of indium-tin oxide;

an electroluminescent medium positioned on each of the plurality of first electrodes so as to define a light emitting diode in conjunction with an associated first electrode of each of the plurality of electrodes; and a layer of metal positioned over the electroluminescent medium and defining a plurality of metallic strips defining a second electrode for each of the light emitting diodes.

21. An integrated electro-optical package as claimed in claim 20 wherein the electrically conductive strips include a second layer of indium-tin oxide positioned on the thin optically transparent layer of metal.

* * * * *

UNITED STATES PATENT AND TRADEMARK OFFICE
CERTIFICATE OF CORRECTION

PATENT NO. : 5,650,640

DATED : July 22, 1997

INVENTOR(S) : John W. Stafford

It is certified that error appears in the above-identified patent and that said Letters Patent is hereby corrected as shown below:

In claim 13, column 12, line 43, delete the number "9" and insert --5--.

Signed and Sealed this

Twenty-fifth Day of November, 1997

Attest:

BRUCE LEHMAN

Attesting Officer

Commissioner of Patents and Trademarks